(12) United States Patent
Meninger et al.

(10) Patent No.: US 9,698,808 B1
(45) Date of Patent: Jul. 4, 2017

(54) PHASE MEASUREMENT AND CORRECTION CIRCUITRY

(71) Applicant: Cavium, Inc., San Jose, CA (US)

(72) Inventors: Scott E. Meninger, Groton, MA (US); Lu Wang, Framingham, MA (US)

(73) Assignee: Cavium, Inc., San Jose, CA (US)

( * ) Notice: Subject to any disclaimer, the term of this patent is extended or adjusted under 35 U.S.C. 154(b) by 0 days.

(21) Appl. No.: 15/335,816

(22) Filed: Oct. 27, 2016

(51) Int. Cl.
*H03M 1/00* (2006.01)
*H03M 1/10* (2006.01)
*H03M 1/12* (2006.01)

(52) U.S. Cl.
CPC ....... *H03M 1/1023* (2013.01); *H03M 1/1071* (2013.01); *H03M 1/1245* (2013.01)

(58) Field of Classification Search
CPC ...... H03M 1/12; H03M 1/002; H03M 1/0624; H03M 1/1255; H03L 7/087; H03L 7/0814; H03L 7/081; H03L 7/0818; H03L 7/085; H03L 2207/50; H03L 7/18; H03L 7/00; H03L 7/183; H03L 7/113
USPC ........ 341/140, 142, 155; 327/144, 156, 147, 327/157, 158, 141, 145
See application file for complete search history.

(56) References Cited

U.S. PATENT DOCUMENTS

| | | | | |
|---|---|---|---|---|
| 7,453,970 | B2* | 11/2008 | Cheung | G06F 1/08 327/144 |
| 9,225,507 | B1* | 12/2015 | Lye | H04L 7/0331 |
| 9,520,890 | B1* | 12/2016 | Ben-Bassat | H03M 1/1014 |
| 2003/0030475 | A1* | 2/2003 | Ishikawa | H03L 7/093 327/291 |
| 2006/0017479 | A1* | 1/2006 | Kim | G11C 7/22 327/158 |
| 2006/0159211 | A1* | 7/2006 | Lin | H04L 27/0014 375/355 |
| 2007/0262823 | A1* | 11/2007 | Cohen | H03D 13/003 331/45 |
| 2009/0207957 | A1* | 8/2009 | Fukuda | H03L 7/081 375/354 |
| 2012/0112936 | A1* | 5/2012 | Huang | H03M 1/502 341/110 |
| 2012/0314825 | A1* | 12/2012 | Dillinger | H04L 7/033 375/371 |
| 2013/0328602 | A1* | 12/2013 | Kibune | H03K 5/1565 327/156 |

* cited by examiner

*Primary Examiner* — Linh Nguyen
(74) *Attorney, Agent, or Firm* — Hamilton, Brook, Smith & Reynolds, P.C.

(57) ABSTRACT

A circuit provides for phase adjustment of an offset clock pair, and includes an analog stage and a digital stage. The analog stage provides for generating an adjusted offset clock pair and detecting a phase difference between the adjusted offset clock pair. The digital stage operates to quantify the phase difference and provide a command for further adjusting the phase of the adjusted offset clock pair, at the analog stage, towards a target phase offset value.

18 Claims, 8 Drawing Sheets

PHASE MEASUREMENT AND CORRECTION CIRCUITRY

BACKGROUND

Driven by the fast advancement of applications in several fields of technology, such as cloud computing, autonomous vehicle, and virtual reality, the demand for increasing data throughput is greater than ever before. A typical hardware platform often employs multi-Gbps serial data links, such as PCI express, Ethernet, and serial ATA (SATA). The challenge for transferring data at such high speed with low-cost hardware, such as an FR4 Printed Circuit Board (PCB), is that a transmission channel through which the data is transferred, can cause severe inter-symbol interference (ISI) as a result of being high-loss, non-linear, and/or reflective. ISI degrades the data received by a receiver, such as a serializer/deserializer (SerDes) receiver, where the degradation can include reduced eye height and eye width of the received data signal. Such degradation can increase at higher speeds of data transfer, leading to errors in the sampling of the data signal.

SUMMARY

Example embodiments include a circuit having an analog stage and a digital stage. The analog stage can include at least a phase adjustment circuit and a phase detector. The phase adjustment circuit may be configured to receive an offset clock pair and output an adjusted offset clock pair. The phase detector can be configured to receive the adjusted offset clock pair and output a phase signal, where the phase signal indicates a phase difference between the adjusted offset clock pair. An analog-to-digital converter may receive the phase signal and output a digital phase value corresponding to the phase signal.

The digital stage can include at least a comparator and an integrator. The comparator may be configured to output an error value based on a comparison of the digital phase value against a reference value. The integrator may be configured to output a phase adjustment value based on the error value, where the phase adjustment circuit adjusts at least one phase of the adjusted offset clock pair based on the phase adjustment value.

In further embodiments, the circuit may include a summer circuit configured to generate a phase adjust signal based on the phase adjustment value and an initial value, where the phase adjustment circuit receives the phase adjustment signal. The phase adjustment circuit may be further configured to adjust the phase of the adjusted offset clock pair towards a phase difference between the adjusted offset clock pair of 90°. The phase adjustment circuit may further include a first interpolator and a second interpolator, where the first interpolator receives a first clock signal of the offset clock pair, and the second interpolator receives a second clock signal of the offset clock pair. In addition, at least one of the first and second interpolators may be configured to output one of the adjusted offset clock pair based on at least one of the offset clock pair and the phase adjustment value.

In still further embodiments, the phase detector can include a symmetric exclusive-OR (XOR) gate, which receives the adjusted offset clock pair and outputs the phase signal. The phase signal can include one or more clock signals having a duty cycle indicating the phase difference between the adjusted offset clock pair. The analog-to-digital converter may further include a sigma-delta analog-to-digital converter configured to output the digital phase value as a low-pass-filtered version of the phase signal. The comparator may employ a tolerance in the reference value when comparing the digital phase value against the reference value. The integrator may include an up-down counter, the counter incrementing and decrementing the up-down counter based on the error value.

Further example embodiments include a clock recovery circuit, which may include a receiver, a clock and data recovery (CDR) circuit, and a clock adjustment circuit. The receiver may be configured to sample an input data signal based on an adjusted offset clock pair, and the CDR circuit may be configured to generate a recovered data signal based on the input data signal. The CDR circuit may also generate an offset clock pair. The clock adjustment circuit may include one or more of the features described above, including a phase adjustment circuit, a phase detector, an analog-to-digital converter, a comparator, and an integrator. The clock adjustment circuit may include an analog stage and a digital stage, the analog stage including the phase adjustment circuit and the phase detector, the digital stage including the comparator and the integrator. The clock recovery circuit may also include a phase-locked loop (PLL), where the CDR circuit generates the offset clock pair based on an output of the PLL.

Further example embodiments include a clock distribution circuit, which may include a clock generator, a clock distribution bus, and a plurality of clock adjustment circuits. The clock generator may be configured to output an offset clock pair, and the clock distribution bus may be connected to the clock generator. The plurality of clock adjustment circuits each may be configured to receive the offset clock pair, via the bus, and output an adjusted offset clock pair to a respective receiver circuit or a circuit utilizing multi-phase clocks. Each of the plurality of clock adjustment circuits may include one or more of the features described above, including a phase adjustment circuit, a phase detector, an analog-to-digital converter, a comparator, and an integrator. The clock adjustment circuit may include an analog stage and a digital stage, the analog stage including the phase adjustment circuit and the phase detector, the digital stage including the comparator and the integrator.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments follows.

Typical data signal receiver circuits, such as a serializer/deserializer (SerDes), are designed with blocks using a half-rate clock, where the clock period is twice the data unit interval (UI) time. With such half-rate architecture, two half-rate clocks are needed for CDR. The edge clock (also referred to as the "in-phase clock") (clki) needs to be aligned with the edge of data, which is synchronized with the transmitter clock. The sampling clock (clkq) is usually targeted to be aligned with the eye center (the middle of the UI) of the incoming data for best receiver performance, because the eye opens the widest near the center depending on the channel characteristics. As a result, clki and clkq must have an accurate phase offset in order to optimize performance of the receiver. However, as data transmission speeds increase, the UI time decreases, and maintaining an accurate phase offset becomes increasingly difficult.

Example embodiments, described below, provide a programmable phase adjustment to maintain an accurate phase offset in applications of high-speed data transmission. Embodiments may be applied to optimize the performance of a data receiver, such as a SerDes, for a variety of different transmission channels.

Figure 1:
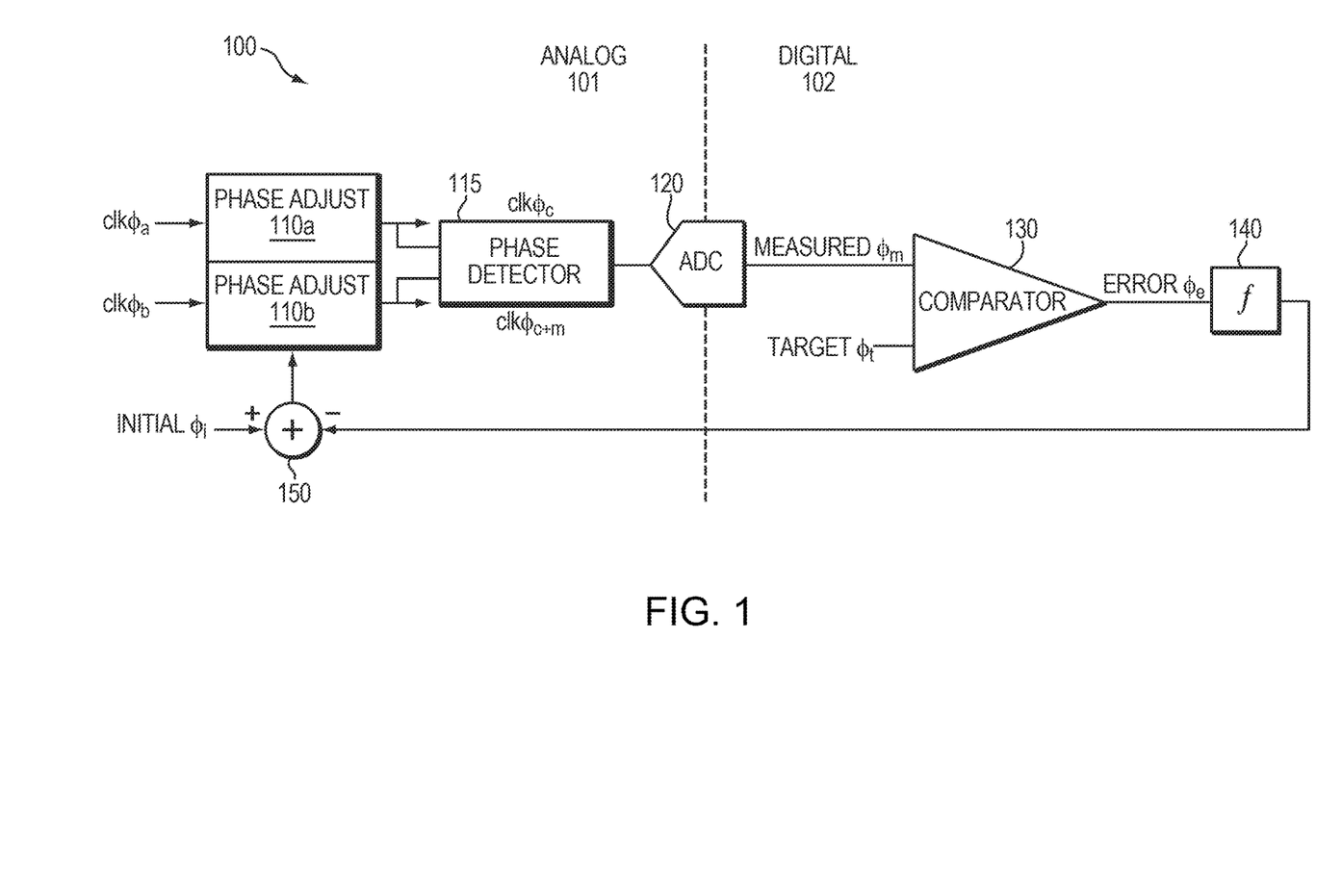
FIG. 1 is a block diagram of a phase error correction circuit in one embodiment.

FIG. 1 is a block diagram of a phase error correction circuit 100 in one embodiment. The circuit 100 may operate generally to receive an offset clock pair $clk\phi_a$, $clk\phi_b$ and output an adjusted offset clock pair $clk\phi_c$, $clk\phi_{c+m}$, where the circuit 100 adjusts the output toward a target offset value. For example, the offset clock pair $clk\phi_a$, $clk\phi_b$ may correspond to an edge clock and a sampling clock, respectively, having a target offset of 90°. However, due to causes such as process, voltage and temperature (PVT) variation effects or transmission interference, the offset clock pair $clk\phi_a$, $clk\phi_b$ may have an offset greater or less than the target value (i.e., a phase error). The circuit 100 may adjust the phase offset of the adjusted offset clock pair $clk\phi_c$, $clk\phi_{c+m}$ to the target value, thereby correcting the phase error. Alternatively, the circuit 100 may be configured to adjust the phase offset of the adjusted offset clock pair $clk\phi_c$, $clk\phi_{c+m}$ towards a new offset that is distinct from the offset of the offset clock pair $clk\phi_a$, $clk\phi_b$ (e.g., 45° or 180°).

The circuit 100 includes an analog stage 101 and a digital stage 102. The analog stage 101 includes phase adjustment circuits 110a, 110b (which may be implemented as separate circuits or as segments of a single, combined circuit) and a phase detector 115. The phase adjustment circuits 110a, 110b receive the offset clock pair $clk\phi_a$, $clk\phi_b$ and output the adjusted offset clock pair $clk\phi_c$, $clk\phi_{c+m}$. The phase detector 115 receives the adjusted offset clock pair $clk\phi_c$, $clk\phi_{c+m}$ and outputs a phase signal, which indicates a phase difference between the adjusted offset clock pair $clk\phi_c$, $clk\phi_{c+m}$. An analog-to-digital converter (ADC) 120 receives the phase signal and outputs a digital phase value "measured (p." corresponding to the phase signal.

The digital stage 102 includes a comparator 130 and an integrator 140. The comparator 130 compares the measured $\phi_m$ against a reference value "target $\phi_t$," that corresponds to a target phase offset. Based on this comparison, the comparator 130 output an error value "error $\phi_e$" indicating a deviation in the offset of the adjusted offset clock pair $clk\phi_c$, $clk\phi_{c+m}$ from the target phase offset. The integrator 140 may be configured to integrate the error value $\phi_e$ to output a phase adjustment value. A summer circuit 150 combines the phase adjustment value with an initial phase value "initial $\phi_i$" before forwarding the final phase adjustment value to the phase adjustment circuits 110a, 110b. The initial phase value $\phi_i$ may be selected based on an initial target phase offset, or may be a based on a measured phase offset of the offset clock pair $clk\phi_a$, $clk\phi_b$. In the configuration illustrated, the phase adjustment value is subtracted from the initial phase value $\phi_i$. Alternatively, the values may be added, or may be combined in other configurations to produce a final phase adjustment value to the phase adjustment circuits 110a, 110b.

The phase adjustment circuits 110a, 110b may adjust the phase of the adjusted offset clock pair $clk\phi_c$, $clk\phi_{c+m}$ respectively, based on the final phase adjustment value. As a result, the circuit 100 generates the adjusted offset clock pair $clk\phi_c$, $clk\phi_{c+m}$ to exhibit a phase offset matching a programmed or selected target value. In alternative embodiments, the phase adjustment circuits 110a, 110b may adjust only a single one of the offset clock pair $clk\phi_a$, $clk\phi_b$ over a given time period. In such an embodiment, the other of the offset clock pair $clk\phi_a$, $clk\phi_b$ may be forwarded substantially unmodified as one of the adjusted offset clock pair $clk\phi_c$, $clk\phi_{c+m}$. In a further alternative embodiment, one of the phase adjustment circuits (e.g., circuit 110a) may be omitted altogether, where one of the offset clock pair $clk\phi_a$, $clk\phi_b$ (e.g., $clk\phi_a$) is forwarded directly to the phase detector 115 and as a component of the adjusted offset clock pair $clk\phi_c$, $clk\phi_{c+m}$ (e.g., $clk\phi_a$-$clk\phi_c$).

The circuit 100 includes the analog stage 101 and the digital stage 102. Although the analog stage 101 generally comprises analog circuitry, one or more components in the analog stage 101 may include digital circuitry. For example, the phase adjustment circuits 110a, 110b may include a combination of analog and digital circuitry, including a digital interpolator.

Figure 2:
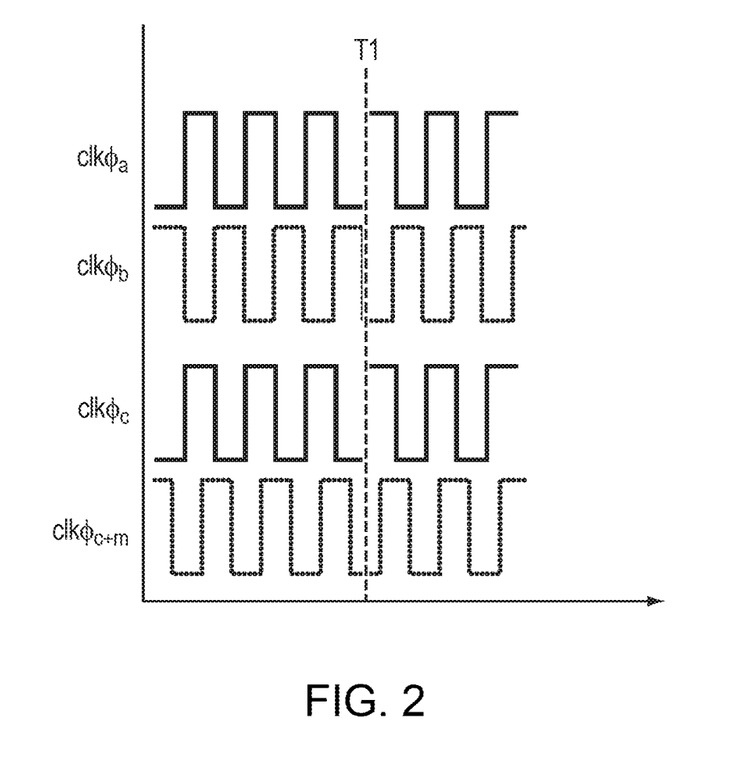
FIG. 2 is a timing diagram illustrating signals of the circuit of FIG. 1.

FIG. 2 is a timing diagram illustrating signals of the circuit 100 of FIG. 1. As shown, the offset clock pair $clk\phi_a$, $clk\phi_b$ is skewed from a target offset of 90°. For example, at time T1, $clk\phi_a$ exhibits a rising edge, while $clk\phi_b$ is near a falling edge. As a result of phase adjustment by the circuit 100, the adjusted offset clock pair $clk\phi_c$, $clk\phi_{c+m}$ exhibits the target phase offset. For example, at time T1, $clk\phi_c$ exhibits a rising edge, while $clk\phi_{c+m}$ is at the center of a down cycle. Thus, the adjusted offset clock pair $clk\phi_c$, $clk\phi_{c+m}$ may be suitable for use as a half-rate sampling clock pair in high-speed data applications, where the $clk\phi_c$ and $clk\phi_{c+m}$ may be applied as an edge clock and a sampling clock, respectively.

Turning back to FIG. 1, the circuit 100 provides a number of advantages. As a result of implementing a digital stage 102, the circuit 100 can accurately measure the phase difference between two clocks in a digital form. This measurement can be output as a digital data value for use in further processing or calibration. As a result of implementing an analog stage 101, the circuit can adjust the phase of high-frequency (e.g., multi-GHz) clocks with picosecond accuracy, and can accurately detect even a minimal phase difference between the clocks. Further, in some embodiments, the digital stage can be implemented with synthesizable register-transfer level (RTL), which can reduce the design cycle and is less susceptible to process variation. Embodiments may be implemented in a range of applications, such as SerDes circuitry, double data rate (DDR) memory circuitry, clock distribution networks, multi-phase clock generation, and radio-frequency (RF) receiver circuitry. Further embodiments, described below, with reference to FIGS. 3-7, include a selection of such applications.

Figure 3:
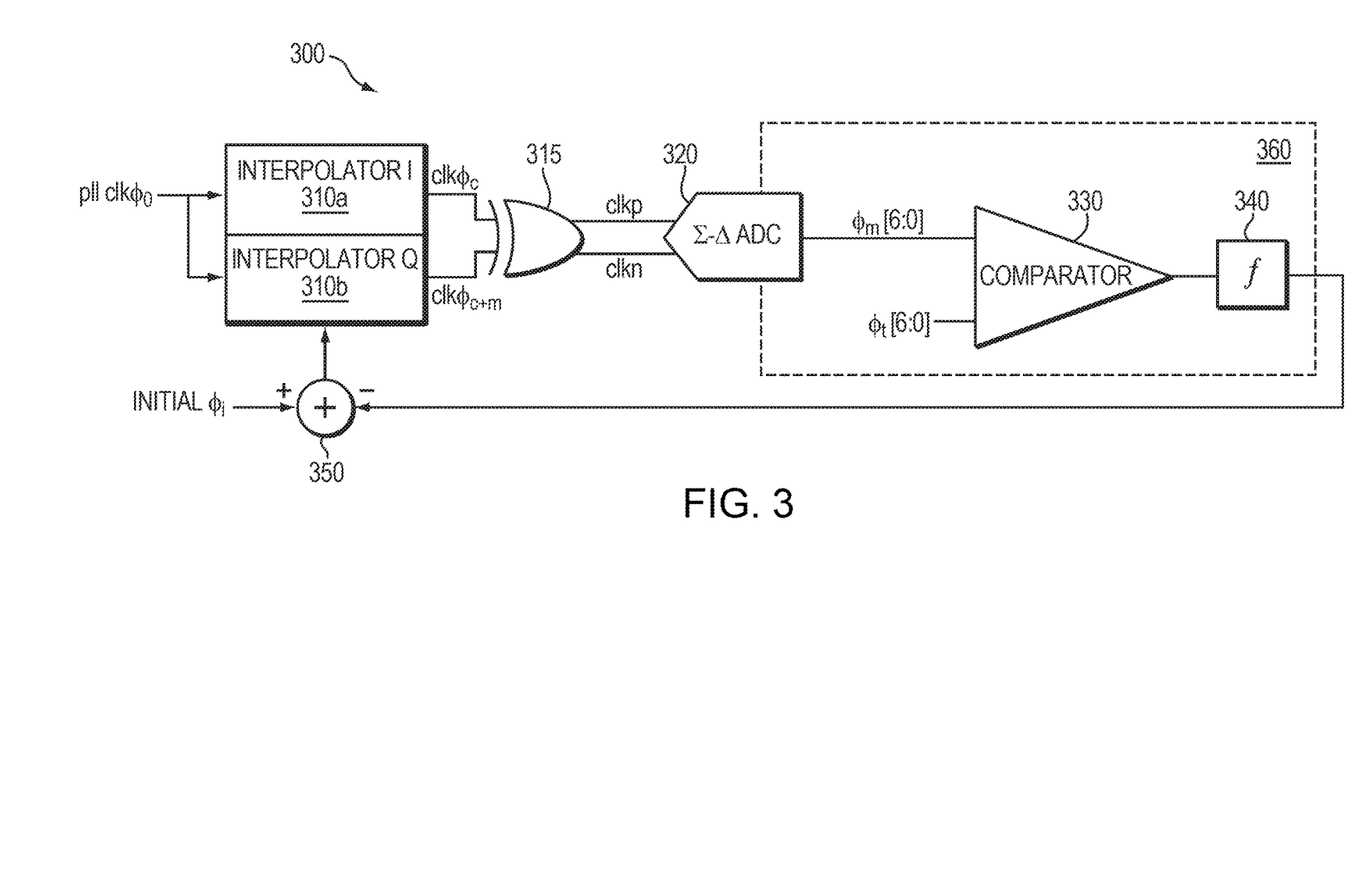
FIG. 3 is a block diagram of a phase error correction circuit in a further embodiment.

FIG. 3 is a block diagram of a phase error correction circuit 300 in a further embodiment. The circuit 300 may include one or more features of the circuit 100 described above with reference to FIG. 1. The circuit 300 may receive a single clock input signal, clkϕ₀ (e.g., a clock signal generated by a phase-locked loop (PLL), not shown), and may output an adjusted offset clock pair clkϕ$_c$, clkϕ$_{c+m}$, where the circuit 300 adjusts the output toward a target offset value. Alternatively, the circuit 300 may receive an offset clock pair as described above with reference to FIG. 1. The circuit 300 may be configured to adjust the phase offset of the adjusted offset clock pair clkϕ$_c$, clkϕ$_{c+m}$ towards a desired phase offset (e.g., 45°, 90°, 180°).

The circuit 300 may include analog components and digital components. The analog components may include interpolators 310a, 310b (which may be implemented as separate circuits or as segments of a single, combined circuit) and a differential high-speed symmetric exclusive-OR (XOR) gate 315. The interpolators 310a, 310b receive the clock input clkϕ₀ and output the adjusted offset clock pair clkϕ$_c$, clkϕ$_{c+m}$. The XOR gate 315 receives the adjusted offset clock pair clkϕ$_c$, clkϕ$_{c+m}$ and outputs a phase clock pair clkp, clkn, which is a complementary clock pair, the duty cycle of which indicates a phase difference between the adjusted offset clock pair clkϕ$_c$, clkϕ$_{c+m}$. A sigma-delta analog-to-digital converter (Σ-Δ ADC) 320 receives the phase clock pair and outputs a digital phase value ϕ$_m$ corresponding to the phase difference. The ADC 320 may also apply a low-pass filter to the phase clock pair clkp, clkn. Although a differential phase detector (XOR gate 315) and a differential ADC 320 are implemented in this embodiment, a single-ended phase detector and ADC may be used in alternative embodiments.

The digital components may be implemented in a single digital circuit 360 (e.g., a synthesizable RTL circuit) and may include a comparator 330 and an integrator 340. The comparator 330 may be implemented as a digital voter, which compares the detected phase ϕ$_m$[6:0] with a target phase ϕ$_t$[6:0] and a "deadzone" value, and generates a vote: "1" if ϕ$_m$<ϕ$_t$-deadzone, "-1" if ϕ$_m$>ϕ$_t$+deadzone, and "0" otherwise. The deadzone value may be a constant used to improve the loop stability. The integrator 340 may be configured to output a phase adjustment value based on the comparator output. The integrator can be implemented as an up-down counter, where the depth of the counter is programmable such that it can be used to set the loop bandwidth for different applications.

A summer circuit 350 combines the phase adjustment value with an initial phase value "initial ϕ$_i$" before forwarding the final phase adjustment value to the interpolators 110a, 110b. The initial phase value ϕ$_i$ may be selected based on an initial target phase offset, such as an estimated target offset based on the frequency of the clock clkϕ₀. The phase adjustment value is subtracted from the initial phase value ϕ$_i$ as illustrated, or, alternatively, the values may be added, or may be combined in other configurations to produce a final phase adjustment value to the interpolators 310a, 310b.

The interpolators 310a, 310b may adjust the phase of the adjusted offset clock pair clkϕ$_c$, clkϕ$_{c+m}$ respectively, based on the final phase adjustment value. As a result, the circuit 300 generates the adjusted offset clock pair clkϕ$_c$, clkϕ$_{c+m}$ to exhibit a phase offset matching a selected target value. In alternative embodiments, the interpolators 310a, 310b may adjust only one of the adjusted offset clock pair clkϕ$_c$, clkϕ$_{c+m}$ over a given time period. In such an embodiment, the other of the adjusted offset clock pair clkϕ$_c$, clkϕ$_{c+m}$ may be substantially the same as the input clock clkϕ₀. In a further alternative, one of the interpolators (e.g., interpolator 110a) may be omitted altogether, where the input clock clkϕ₀ is forwarded directly to the XOR gate 315 and as a component of the adjusted offset clock pair clkϕ$_c$, clkϕ$_{c+m}$ (e.g., clkϕ₀=clkϕ$_c$).

The phase error correction circuit 300 benefits from implementing a combination of analog and digital circuit components, where analog circuitry (e.g., interpolators 310a, 310b and XOR gate 315) provide accurate phase adjustment and phase detection, and the digital circuit 310 can provide digital data values, reprogrammability, and reduced design time. The digital circuit is also less subject to process variation. Alternatively, one or more analog components may include digital circuitry. For example, the interpolators 310a, 310b may include a combination of analog and digital circuitry, including a digital interpolator.

Figure 4:
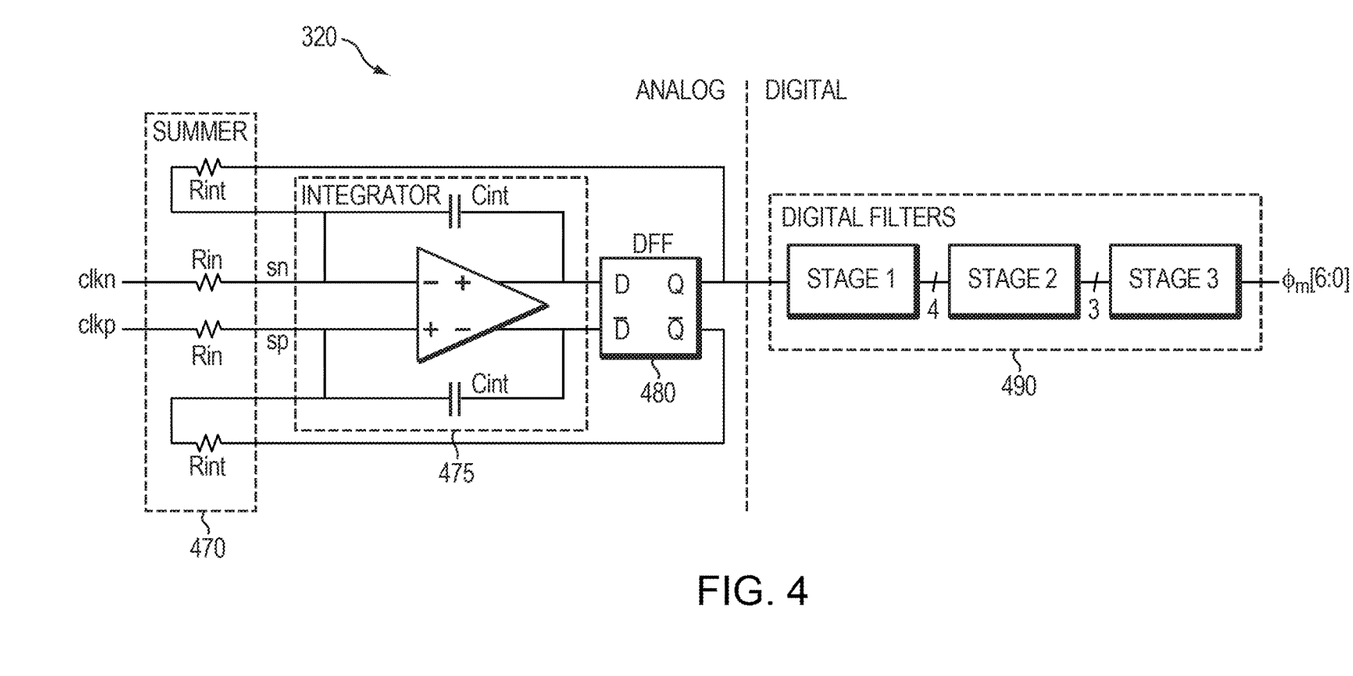
FIG. 4 is a block diagram of an analog-to-digital converter (ADC) implemented in the circuit of FIG. 3.

FIG. 4 is a block diagram of a continuous-time Σ-Δ ADC 320 that may be implemented in the circuit of FIG. 3. The ADC generally includes, at an analog stage, a summer 470, an integrator 475, and a data flip-flop (DFF) 480. The integrator 475 includes an operational amplifier. However, a CMOS inverter may be used in place of the operational amplifier for applications that require less phase detection accuracy.

The network of resistors Rin and Cint provides an anti-aliasing filter, and operates to convert the duty cycle of the incoming clock into a DC voltage that is measured by the ADC 320. The DFF 480 converts this voltage level to a digital bit stream at its output. At the digital stage, the digital filters 490 suppress the high-frequency quantization noise produced by the analog portion of the ADC 320 and generate a 7-bit output ϕ$_m$[6:0] based on the frequency of occurrence of 1s and 0s in the input bit stream. In an example calculation, the phase offset between clkϕ$_c$ and clkϕ$_{c+m}$ may be derived as 180°×D(ϕ$_m$[6:0])/128. Alternatively, the ADC 320 may generate an output of greater or fewer bits in accordance with the desired accuracy of the ADC 320.

The digital filters 490 may include three stages. Stage 1 may be a counter, which can lower the sampling speed for the subsequent stages. Stages 2 and 3 may include first-order infinite impulse response (IIR) filters (finite impulse response (FIR) filters can be used to replace the IIR filters for better stability, at the expense of greater more chip area and power consumption). In an alternative embodiment, the ADC 320 may be configured to provide higher-order modulation by cascading multiple integration stages, thereby providing increased resolution. Such an embodiment may also include a higher-order filter at the digital stage to suppress quantization noise.

Figure 5:
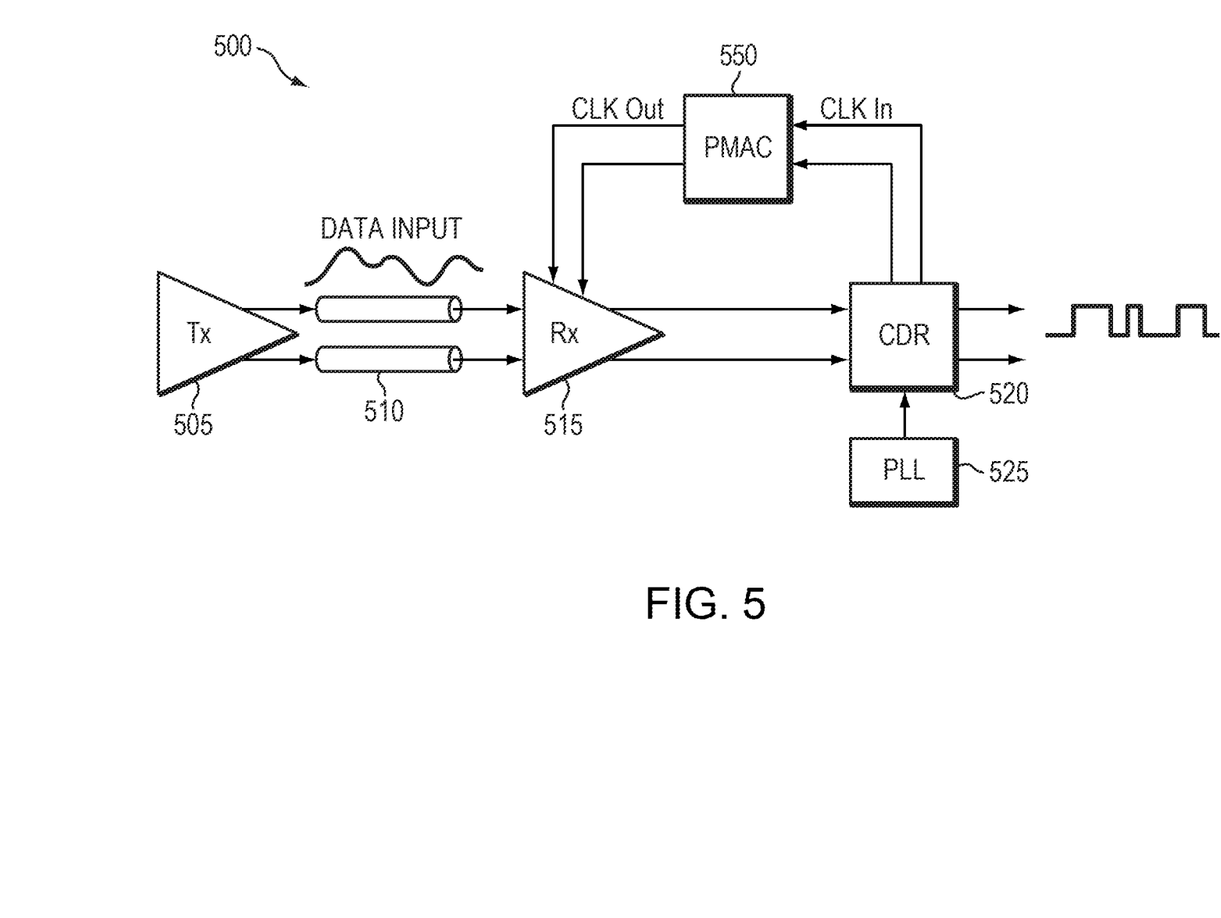
FIG. 5 is a block diagram of a portion of a serializer/deserializer implementing a clock recovery circuit in an example embodiment.

FIG. 5 is a block diagram of a portion of a SerDes circuit 500 implementing an example embodiment. The circuit 500 includes a receiver 515 configured to receive a data input signal from a transmitter 505 across a transmission channel 510. Due to various effects introduced by traversing the transmission channel 510, the data input signal may arrive at the receiver 515 in a degraded state. Accordingly, the receiver 515 samples the data input signal and forwards the sampled data signal to a clock and data recovery (CDR) circuit 520. The CDR 520 processes the sampled data signal, based on a clock signal provided by a PLL 525, to generate a recovered data output signal and a recovered clock signal CLK in. The recovered clock signal CLK in may include an offset clock pair, which can be used by subsequent circuitry to sample the recovered data output signal.

A phase measurement and correction (PMAC) circuit 550 may include features of the circuits 100, 300 described above with reference to FIGS. 1-4, and may be configured to receive the recovered clock signal CLK in and generate an adjusted offset clock pair CLK out. If the clock input CLK in is an offset clock pair, the PMAC circuit 550 may provide the output CLK out as a corrected offset clock pair. Alternatively, if the clock input CLK in is a single clock signal, the PMAC circuit 550 may generate an offset clock pair based on the single clock input. The receiver 515 may then use the adjusted offset clock pair CLK out to sample the data input signal. As a result, the PMAC circuit 550 improves sampling of the SerDes circuit 500. Further, by including a digital stage (as described above with reference to FIGS. 1 and 3), the PMAC circuit 550 provides for quantifying the phase offset of the internal clock of the SerDes circuit 500.

Figure 6:
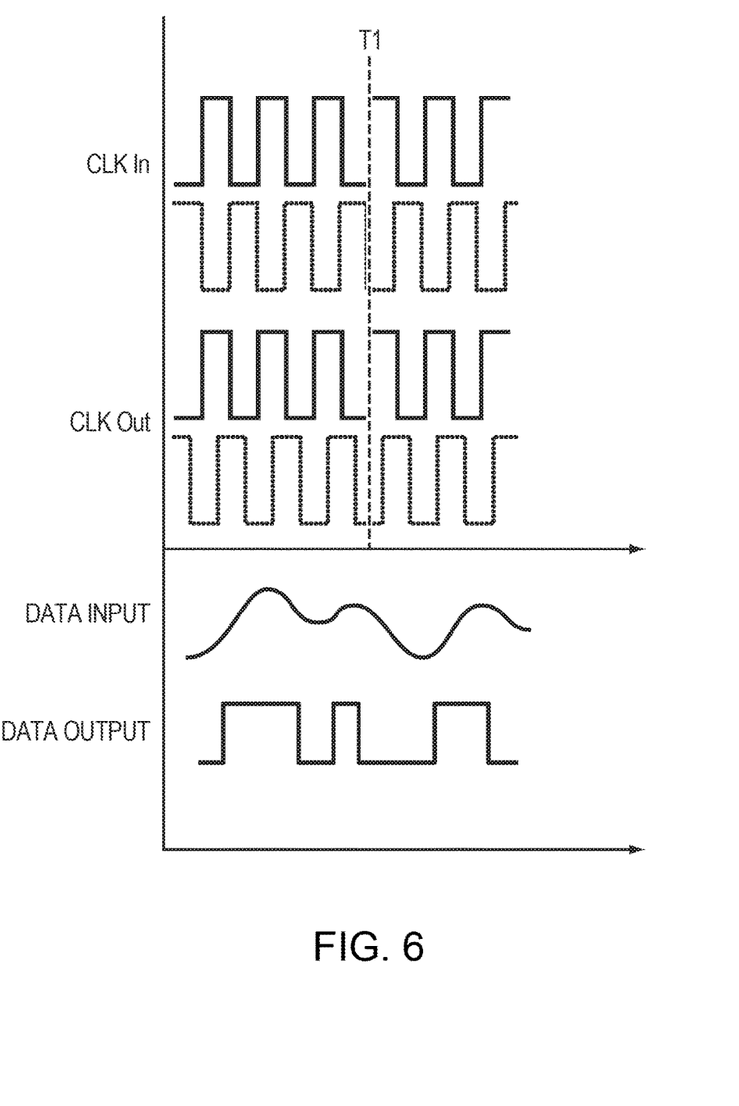
FIG. 6 is a timing diagram illustrating signals of the circuit of FIG. 5.

FIG. 6 is a timing diagram illustrating signals of the SerDes circuit 500 of FIG. 5. As shown, the CDR circuit 520 provides a recovered data output signal corresponding to the degraded data input signal. Further, the offset clock pair CLK in, generated by the CDR circuit 520, is skewed from a target offset of 90°. For example, at time T1, a first clock signal exhibits a rising edge, while a second clock signal is near a falling edge. As a result of phase adjustment by the PMAC circuit 550, the adjusted offset clock pair CLK out exhibits the target phase offset. For example, at time T1, a first clock signal exhibits a rising edge, while a second clock signal is at the center of a down cycle. Thus, the adjusted offset clock pair CLK out may be suitable for use as a half-rate sampling clock pair at the receiver 515, for sampling the data input signal in high-speed data applications.

Figure 7:
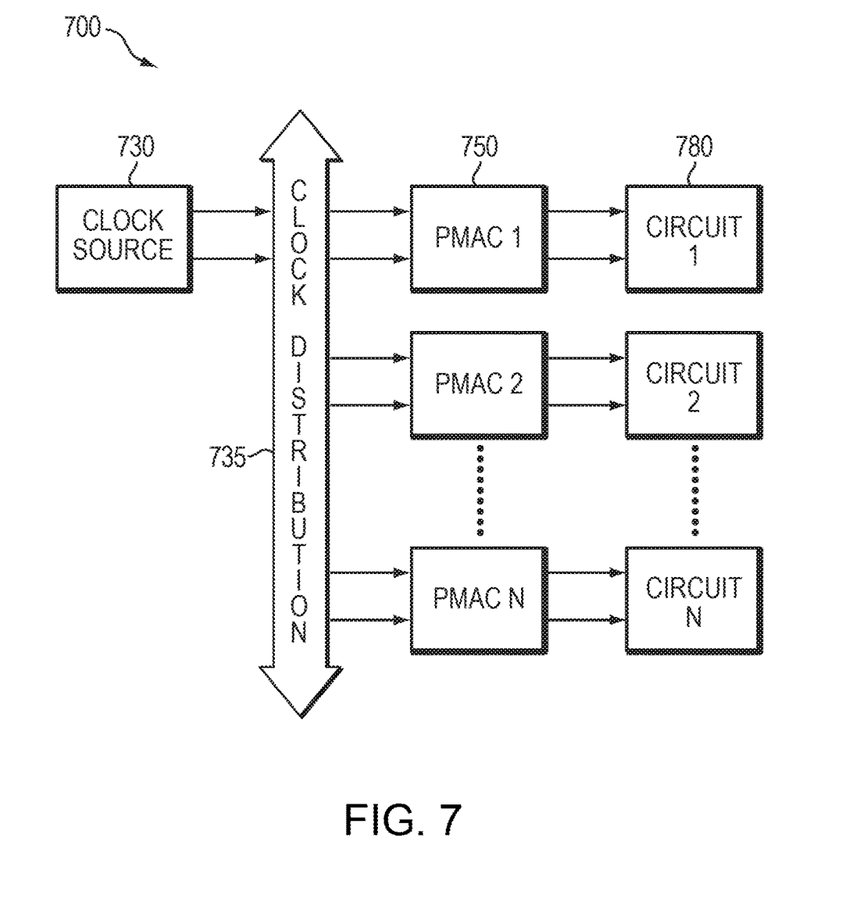
FIG. 7 is a block diagram of a clock distribution system implementing an example embodiment.

FIG. 7 is a block diagram of a clock distribution network 700 implementing an example embodiment. The network 700 may include a clock generator 730, a clock distribution bus 735, and a plurality PMAC circuits 750 each delivering an adjusted offset clock pair to a respective one of a plurality of receiver circuits 780. The receiver circuits 780 may be any circuit suitable to utilize the adjusted offset clock pair. The clock source 730 may output an offset clock pair (or, alternatively, a single reference clock), which is distributed to each of the PMAC circuits 750 via the bus 735.

However, distribution of the offset clock pair across the network 700 may degrade the signal, resulting in an error in the phase offset between the clock pair. To correct such degradation and provide an improved clock pair having a target phase offset, each of the plurality of PMAC circuits 750 may include features of the circuits 100, 300, 500 described above with reference to FIGS. 1-6, and may be configured to receive the offset clock pair (or single clock signal) from the clock source 730. Based on this offset clock pair, each of the PMAC circuit 750 can generate an adjusted offset clock pair for use by the respective receiver circuit 780.

Figure 8:
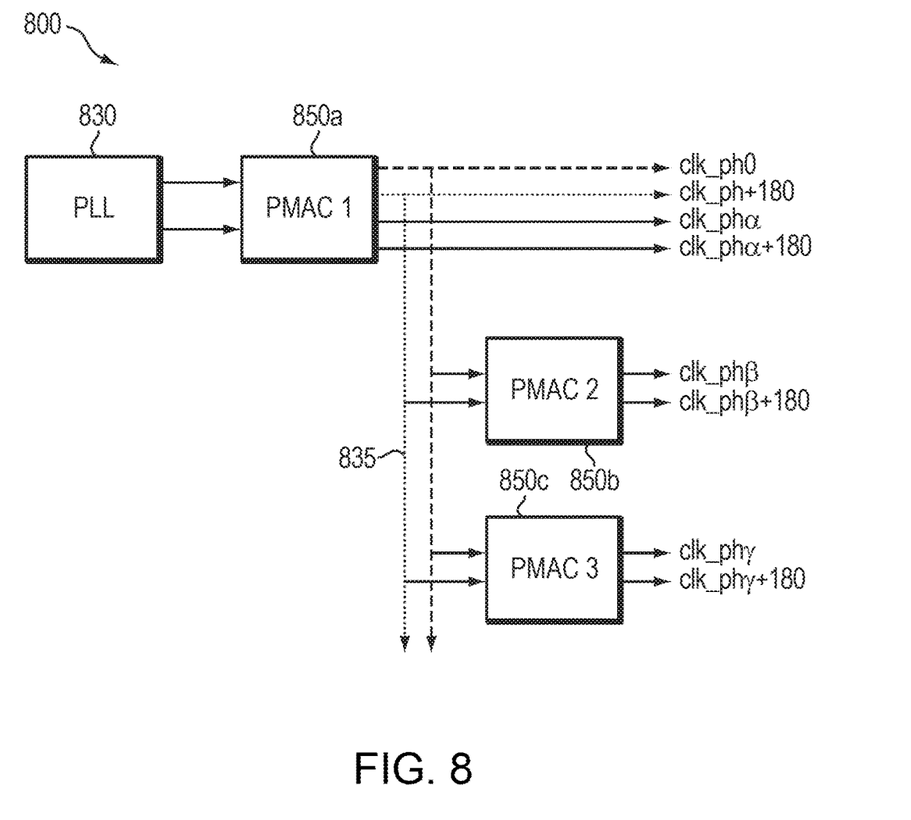
FIG. 8 is a block diagram of a multi-phase clock generator implementing an example embodiment.

FIG. 8 is a block diagram of a multi-phase clock generator circuit 800 implementing an example embodiment. The circuit 800 may include a PLL circuit 830 configured to output a clock signal or a clock pair to a first PMAC circuit 850a. The first PMAC circuit 850 may be configured to output a first clock pair, clk_ph0 and its complement, clk_ph+180, which may correspond to a clock pair received from the PLL circuit 830. The first PMAC circuit 850a may also output an adjusted clock pair, clk_phα and clk_phα+180, which may correspond to the first clock pair with a programmed phase adjustment of value α. Likewise, second and third PMAC circuits 830b, 830c may each receive the first clock pair clk_ph0, clk_ph+180 and output adjusted clock pairs clk_phβ, clk_phβ+180 and clk_phγ, clk_phγ+180, respectively, which may correspond to the first clock pair with a programmed phase adjustment of values β and γ, respectively. As a result, the circuit 800 generates multiple clock pairs each exhibiting different phases corresponding to programmed phase adjustment values. The second and third PMAC circuits 850b, 850c may receive the first clock pair clk_ph0, clk_ph+180 via a common bus 835, which may be connected to the first PMAC circuit 850a and/or the PLL circuit 830. The PMAC circuits 850a-c may include features of the circuits 100, 300, 500 described above with reference to FIGS. 1-6.

While example embodiments have been particularly shown and described above, it will be understood by those skilled in the art that various changes in form and details may be made therein without departing from the scope of the invention encompassed by the appended claims.

What is claimed is:

1. A circuit comprising:
 a phase adjustment circuit configured to receive an offset clock pair and output an adjusted offset clock pair, and
 a phase detector configured to receive the adjusted offset clock pair and output a phase signal, the phase signal indicating a phase difference between the adjusted offset clock pair;
 an analog-to-digital converter configured to receive the phase signal and output a digital phase value corresponding to the phase signal; and
 a comparator configured to output an error value based on a comparison of the digital phase value against a reference value, and
 an integrator configured to output a phase adjustment value based on the error value, the phase adjustment circuit adjusting at least one phase of the adjusted offset clock pair based on the phase adjustment value.

2. The circuit of claim 1, further comprising a summer circuit configured to generate a phase adjust signal based on the phase adjustment value and an initial value, the phase adjustment circuit receiving the phase adjustment signal.

3. The circuit of claim 1, wherein the phase adjustment circuit is further configured to adjust the at least one phase of the adjusted offset clock pair towards a phase difference between the adjusted offset clock pair of 90°.

4. The circuit of claim 1, wherein the phase adjustment circuit includes a first interpolator and a second interpolator, the first interpolator receiving a first clock signal of the offset clock pair, the second interpolator receiving a second clock signal of the offset clock pair.

5. The circuit of claim 4, wherein at least one of the first and second interpolators is further configured to output one of the adjusted offset clock pair based on at least one of the offset clock pair and the phase adjustment value.

6. The circuit of claim 1, wherein the phase detector includes a symmetric exclusive-OR (XOR) gate, the symmetric XOR gate receiving the adjusted offset clock pair and outputting the phase signal.

7. The circuit of claim 6, wherein the phase signal includes at least one clock signal having a duty cycle indicating the phase difference between the adjusted offset clock pair.

8. The circuit of claim 1, wherein the analog-to-digital converter includes a sigma-delta analog-to-digital converter configured to output the digital phase value as a low-pass-filtered version of the phase signal.

9. The circuit of claim 1, wherein the reference value includes a tolerance value.

10. The circuit of claim 1, wherein the integrator includes an up-down counter, the counter incrementing and decrementing the up-down counter based on the error value.

11. The circuit of claim 1, further comprising a first stage and a second stage, the first stage including the phase adjustment circuit and the phase detector, the second stage including the comparator and the integrator.

12. The circuit of claim 11, wherein the first stage is an analog stage and the second stage is a digital stage.

13. A clock recovery circuit comprising:
a receiver configured to sample an input data signal based on an adjusted offset clock pair;
a clock and data recovery (CDR) circuit configured to generate a recovered data signal based on the input data signal, the CDR circuit further generating an offset clock pair; and
a clock adjustment circuit including:
   a phase adjustment circuit configured to receive the offset clock pair and output the adjusted offset clock pair,
   a phase detector configured to receive the adjusted offset clock pair and output a phase signal, the phase signal indicating a phase difference between the adjusted offset clock pair,
   an analog-to-digital converter configured to receive the phase signal and output a digital phase value corresponding to the phase signal,
   a comparator configured to output an error value based on a comparison of the digital phase value against a reference value, and
   an integrator configured to output a phase adjustment value based on the error value, the phase adjustment circuit adjusting at least one phase of the adjusted offset clock pair based on the phase adjustment value.

14. The circuit of claim 13, wherein the clock adjustment circuit includes an analog stage and a digital stage, the analog stage including the phase adjustment circuit and the phase detector, the digital stage including the comparator and the integrator.

15. The circuit of claim 13, further comprising a phase-locked loop (PLL), the CDR circuit generating the offset clock pair based on an output of the PLL.

16. A clock distribution circuit comprising:
a clock generator configured to output an offset clock pair;
a clock distribution bus connected to the clock generator; and
a plurality of clock adjustment circuits each configured to receive the offset clock pair, via the clock distribution bus, and output an adjusted offset clock pair to a respective receiver circuit, each of the plurality of clock adjustment circuits including:
   a phase adjustment circuit configured to receive the offset clock pair and output the adjusted offset clock pair,
   a phase detector configured to receive the adjusted offset clock pair and output a phase signal, the phase signal indicating a phase difference between the adjusted offset clock pair,
   an analog-to-digital converter configured to receive the phase signal and output a digital phase value corresponding to the phase signal,
   a comparator configured to output an error value based on a comparison of the digital phase value against a reference value, and
   an integrator configured to output a phase adjustment value based on the error value, the phase adjustment circuit adjusting at least one phase of the adjusted offset clock pair based on the phase adjustment value.

17. The circuit of claim 16, wherein the clock adjustment circuit includes an analog stage and a digital stage, the analog stage including the phase adjustment circuit and the phase detector, the digital stage including the comparator and the integrator.

18. The circuit of claim 16, wherein each of the plurality of clock adjustment circuits is further configured to output the respective adjusted clock pair at a phase that is distinct from a phase of at least one other adjusted clock pair.

* * * * *